(12) United States Patent
Sung et al.

(10) Patent No.: US 11,195,718 B2
(45) Date of Patent: Dec. 7, 2021

(54) SPACER OPEN PROCESS BY DUAL PLASMA

(71) Applicants: Mattson Technology, Inc., Fremont, CA (US); Beijing E-Town Semiconductor Technology Co., Ltd., Beijing (CN)

(72) Inventors: Tsai Wen Sung, Fremont, CA (US); Chun Yan, San Jose, CA (US); Hua Chung, Saratoga, CA (US); Michael X. Yang, Palo Alto, CA (US); Dixit V. Desai, Pleasanton, CA (US); Peter J. Lembesis, Boulder Creek, CA (US)

(73) Assignees: Beijing E-Town Semiconductor Technology Co., Ltd., Beijing (CN); Mattson Technology, Inc., Fremont, CA (US)

(*) Notice: Subject to any disclaimer, the term of this patent is extended or adjusted under 35 U.S.C. 154(b) by 0 days.

(21) Appl. No.: 16/916,849

(22) Filed: Jun. 30, 2020

(65) Prior Publication Data

US 2021/0005456 A1 Jan. 7, 2021

Related U.S. Application Data

(60) Provisional application No. 62/870,184, filed on Jul. 3, 2019.

(51) Int. Cl.
*H01L 21/033* (2006.01)
*H01L 21/311* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/31116* (2013.01)

(58) Field of Classification Search
None
See application file for complete search history.

(56) References Cited

U.S. PATENT DOCUMENTS

| 9,362,133 B2 | 6/2016 | Shamma et al. |
| 9,478,433 B1 | 10/2016 | Zhou et al. |
| | (Continued) | |

FOREIGN PATENT DOCUMENTS

| CN | 105580118 A | 5/2016 |
| CN | 107636793 A | 1/2018 |

OTHER PUBLICATIONS

PCT International Search Report and Written Opinion for corresponding PCT Application No. PCT/US2020/040445, dated Oct. 15, 2020—11 pages.

*Primary Examiner* — Roberts P Culbert
(74) *Attorney, Agent, or Firm* — Dority & Manning, P.A.

(57) ABSTRACT

Systems and methods for processing a workpiece are provided. In one example, a method includes placing a workpiece on a workpiece support in a processing chamber. The method includes performing a spacer treatment process to expose the workpiece to species generated from a first process gas in a first plasma to perform a spacer treatment process on a spacer layer on the workpiece. The first plasma can be generated in the processing chamber. After performing the spacer treatment process, the method can include performing a spacer etch process to expose the workpiece to neutral radicals generated from a second process gas in a second plasma to etch at least a portion of the spacer layer on the workpiece. The second plasma can be generated in a plasma chamber that is remote from the processing chamber.

12 Claims, 6 Drawing Sheets

(56) References Cited

U.S. PATENT DOCUMENTS

| | | | |
|---|---|---|---|
| 9,576,809 B2 | 2/2017 | Korolik et al. | |
| 9,721,807 B2 | 8/2017 | Zhou et al. | |
| 9,892,917 B2 * | 2/2018 | Swaminathan | H01L 21/67196 |
| 10,128,086 B1 | 11/2018 | Huang et al. | |
| 10,192,743 B2 | 1/2019 | Sherpa et al. | |
| 2010/0099263 A1 | 4/2010 | Kao et al. | |
| 2013/0052827 A1 * | 2/2013 | Wang | H01L 21/31116 |
| | | | 438/694 |
| 2014/0170853 A1 | 6/2014 | Shamma et al. | |
| 2015/0126039 A1 | 5/2015 | Korolik et al. | |
| 2015/0155176 A1 | 6/2015 | Mignot et al. | |
| 2016/0293438 A1 | 10/2016 | Zhou et al. | |
| 2017/0069495 A1 | 3/2017 | Mohanty et al. | |
| 2017/0243754 A1 | 8/2017 | Tavernier et al. | |
| 2018/0061653 A1 | 3/2018 | Sherpa et al. | |
| 2018/0261462 A1 | 9/2018 | Sherpa et al. | |
| 2018/0277385 A1 | 9/2018 | Sherpa et al. | |

* cited by examiner

SPACER OPEN PROCESS BY DUAL PLASMA

PRIORITY CLAIM

The present application claims the benefit of priority of U.S. Provisional Application Ser. No. 62/870,184, filed on Jul. 3, 2019, titled "Spacer Open Process by Dual Plasma," which is incorporated herein by reference.

FIELD

The present disclosure relates generally to processing of a workpiece, such as a semiconductor workpiece.

BACKGROUND

The processing of semiconductor workpieces can involve the deposition and removal of different materials layers on a substrate. Device dimension and materials thickness continue to decrease in semiconductor processing with shrinking critical dimensions in semiconductor devices. In advanced device nodes, material removal with high selectivity to other material can become increasingly important to semiconductor device performance. Self-aligned multiple patterning techniques (e.g., self-aligned double patterning (SADP), self-aligned quadruple patterning (SAQP)) can achieve reduced feature sizes with conventional lithography tool resolution.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The method includes placing a workpiece on a workpiece support in a processing chamber. The method includes performing a spacer treatment process to expose the workpiece to species generated from a first process gas in a first plasma to perform a spacer treatment process on a spacer layer on the workpiece. The first plasma can be generated in the processing chamber. After performing the spacer treatment process, the method can include performing a spacer etch process to expose the workpiece to neutral radicals generated from a second process gas in a second plasma to etch at least a portion of the spacer layer on the workpiece. The second plasma can be generated in a plasma chamber that is remote from the processing chamber.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
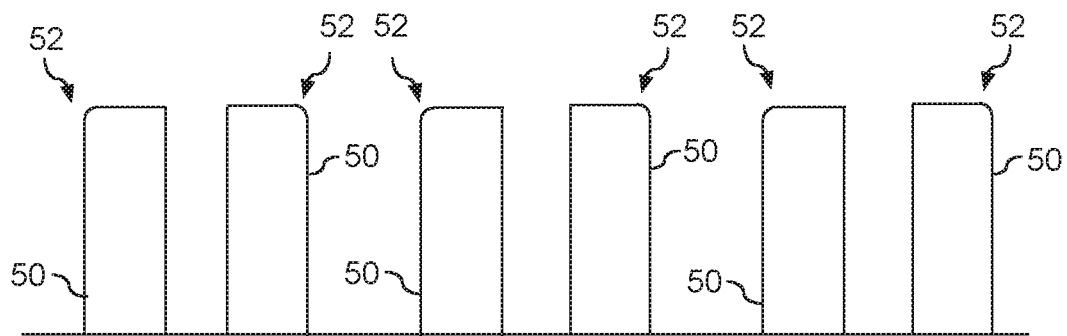
FIG. 1 depicts a spacer structure disposed on a workpiece.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to processes for self-aligned multiple patterning (e.g., self-aligned double patterning (SADP), self-aligned quadruple patterning (SAQP)) on workpieces. Device dimension and thickness of materials continue to decrease with shrinking critical dimension in semiconductor devices. In fabrication of advanced logic and memory (e.g. dynamic random-access memory DRAM) devices, a so-called self-aligned multiple patterning technology can be an economic approach to significantly reduce feature size with conventional lithography tool resolution. In an example SADP process flow, a mandrel structure is formed on a substrate. A spacer layer (e.g., SiN layer) is formed over the mandrel structure using a deposition process (e.g., atomic layer deposition process). The spacer is opened at the top and bottom to form a spacer pair structure with mandrel (e.g. silicon) material in between. Subsequently, the mandrel material is selectively removed with the spacer structure remaining intact. The spacer structure further serves as a hardmask in a following anisotropic ion spacer etch process to transfer its pattern to underlying materials. In another example of process flow, a self-aligned double patterning (SADP) scheme can be repeated in a so called self-aligned quadruple patterning (SAQP) scheme.

Self-aligned multiple patterning processes can pose challenges. For instance, residual spacer material can cause micro-masking effects, leading to mandrel residues remaining during subsequent etch steps. Use of pure radical etching from, for instance, a remote plasma source can reduce spacer critical dimension, which can reduce accurate pattern transfer. Oxide loss (e.g., $SiO_2$) at the bottom of a structure can cause issues in subsequent pattern transfer steps due to uneven oxide that requires removal. As another example, when capacitively coupled plasmas are used, the spacer top profile can be asymmetric (e.g. severe faceting), leading to nonuniform ion deflection in later process steps.

According to example aspects of the present disclosure, a method for processing a workpiece (e.g., as part of a self-aligned multiple patterning process) can include, for instance, a spacer treatment process and a spacer etch process. The spacer treatment process can be used to treat a spacer (e.g., SiN spacer) disposed on a mandrel structure (e.g., silicon mandrel). The spacer treatment process can generate species using a capacitively coupled plasma in the processing chamber from a process gas with H-containing chemistry, such as $H_2$, $CH_4$, etc. The process gas can, in some embodiments, include an inert gas (e.g., Ar, He, etc.) to act as diluent. The spacer treatment process can be implemented by generating a capacitively coupled plasma in a processing chamber using a bias electrode disposed in a workpiece support used to support the workpiece in the processing chamber. The spacer treatment process can be implemented at lower pressure (e.g., less than about 100 mTorr) and high bias power (e.g., about 75 to about 150 Wb). The spacer treatment process can modify the spacer surface (e.g., SiN surface) prior to conducting a spacer etch process.

The spacer etch process can generate species from a process gas in a remote plasma chamber using an inductively coupled plasma. The species can be filtered so that radicals (e.g., neutral radicals) are exposed to the workpiece in the processing chamber to etch the spacer. The process gas for the spacer etch step can include a fluorine containing chemistry, such as $NF_3$, $SF_6$, etc. The process gas can, in some embodiments, include an $O_2$ gas to assist in F radical dissociation. The process gas can, in some embodiments, include an inert gas (e.g., Ar, He, etc.) to act as diluent. The spacer etch process can be performed at higher pressure (e.g., greater than about 300 mTorr) relative to the spacer treatment process.

In some embodiments, a purge process can be implemented between the spacer etch process and the spacer treatment process. The purge process can purge gases and residue in the processing chamber using an inert gas (e.g., Ar, He, etc.). In this way, the spacer treatment process and the spacer etch process can be performed in situ in the same processing chamber without having to transfer workpieces between different processing chambers, leading to increased efficiency in processing time.

The spacer treatment process and the spacer etch process can be repeated cyclically in an alternating manner until the spacer material is etched sufficiently (e.g., opened) and the mandrel structure is exposed. Once the mandrel structure is exposed, a mandrel removal process can be performed to remove the mandrel, leaving the spacers for transferring a pattern to the underlying material.

Example aspects of the present disclosure can provide a number of technical effects and benefits. For instance, with dual plasmas (e.g., capacitively coupled plasma and inductively coupled plasma), reactive ion etching (RIE) can be incorporated and tuned such that a spacer opening step as part of the self-aligned multiple pattern process can be achieved good anisotropy with reduced residues.

Figure 2:
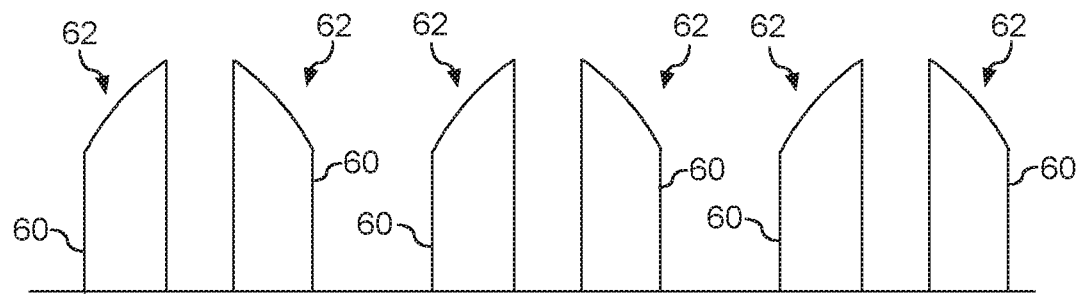
FIG. 2 depicts a spacer structure disposed on a workpiece.

In example embodiments, the method(s) according to example aspects of the present disclosure can lead to more rounded and symmetric spacer profiles. More particularly, FIG. 1 depicts an example spacer profile of a SiN spacer 50 resulting from performing a spacer treatment process followed by a spacer etch process according to example aspects of the present disclosure. The SiN spacer 50 has a rounded profile edge 52. FIG. 2 depicts an example spacer profile of a SiN spacer 60 generated using, for instance, a capacitively coupled plasma without a spacer treatment step according to example aspects of the present disclosure. The SiN spacer 60 has a sharp sloped profile edge 62. As demonstrated in FIGS. 1 and 2, the spacer 50 has a more rounded and symmetric profile relative to the spacer 60. The sharp sloped profile edge 62 can lead to nonuniform ion deflection in later process steps. By having more rounded and symmetric profile for the spacer 50 (e.g., spacer profile edge 52), ion deflection in later process steps can be reduced.

Aspects of the present disclosure are discussed with reference to a "workpiece." A workpiece can include a semiconductor wafer for purposes of illustration and discussion. Those of ordinary skill in the art, using the disclosures provided herein, will understand that the example aspects of the present disclosure can be used in association with any workpiece (e.g., semiconductor substrate or other suitable substrate). In addition, the use of the term "about" in conjunction with a numerical value is intended to refer to within twenty percent (20%) of the stated numerical value.

As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a workpiece support operable to support the workpiece.

Figure 3:
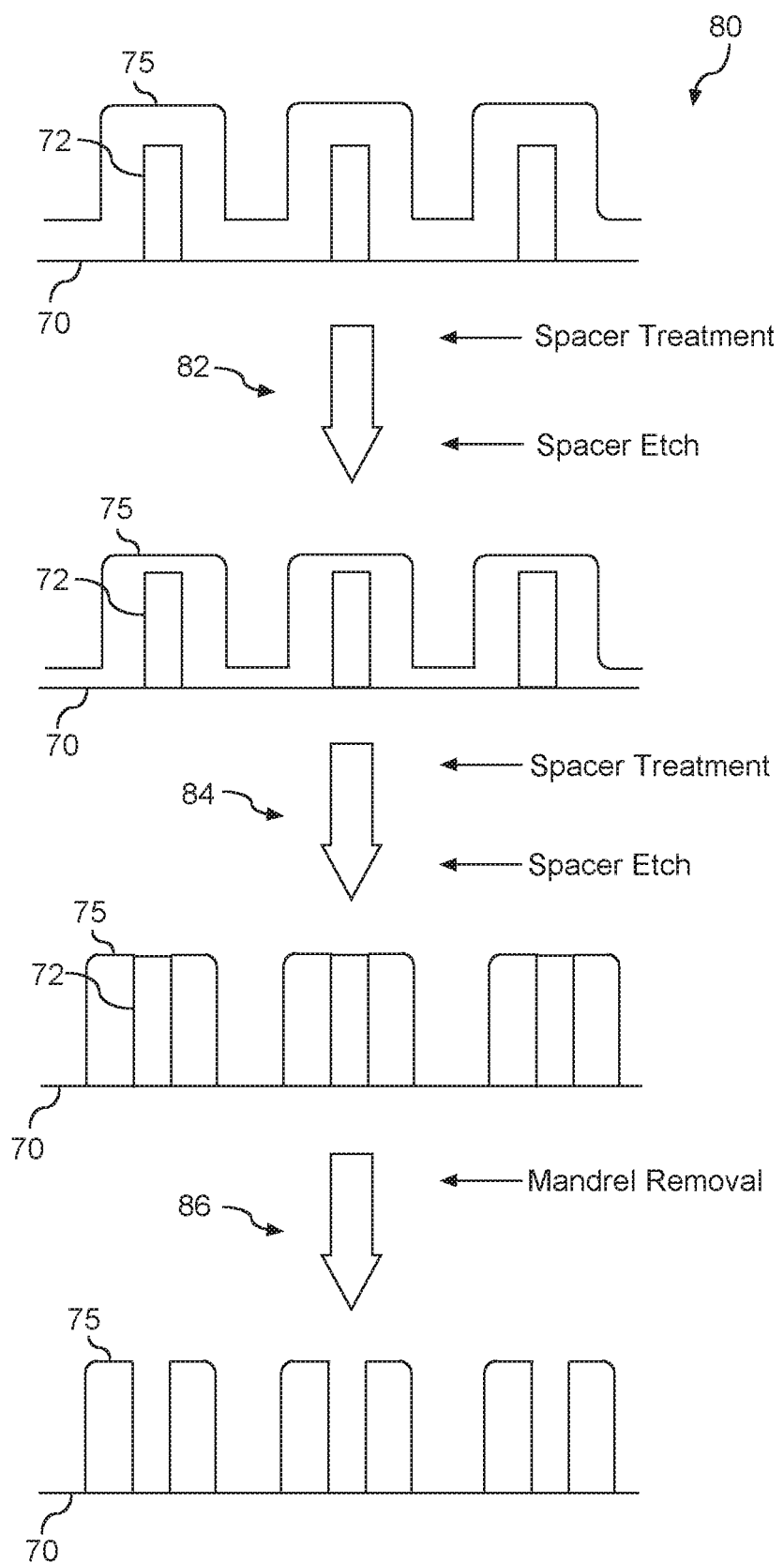
FIG. 3 depicts a process according to example embodiments of the present disclosure.

FIG. 3 depicts an overview of an example method 80 for self-aligned multiple patterning according to example embodiments of the present disclosure. For instance, a workpiece can include a patterned structure that includes one or more mandrel structures 72 (e.g., silicon mandrels) disposed on a substrate layer 70. The substrate layer 70 can be a semiconductor layer (e.g., Si, SiGe) and/or a dielectric layer (e.g., $SiO_2$). A spacer layer 75 can be disposed over the mandrel structures 72. The spacer layer can be, for instance, a SiN spacer layer.

The workpiece can undergo one cycle 82 of a spacer treatment process followed by a spacer etch process to at least partially remove a portion of the spacer 75. Details concerning an example spacer treatment process and a spacer etch process will be discussed below. The cycle 82 can be repeated at 84 and more times as necessary or desired until a sufficient amount of spacer 75 has been removed to expose the mandrel structure 72. A mandrel removal process 86 can be implemented to remove the mandrel structure and leave the spacers 75 on the substrate layer 70. An etch process can then be used to transfer the pattern formed by the spacers 75 to the substrate layer 70.

Figure 4:
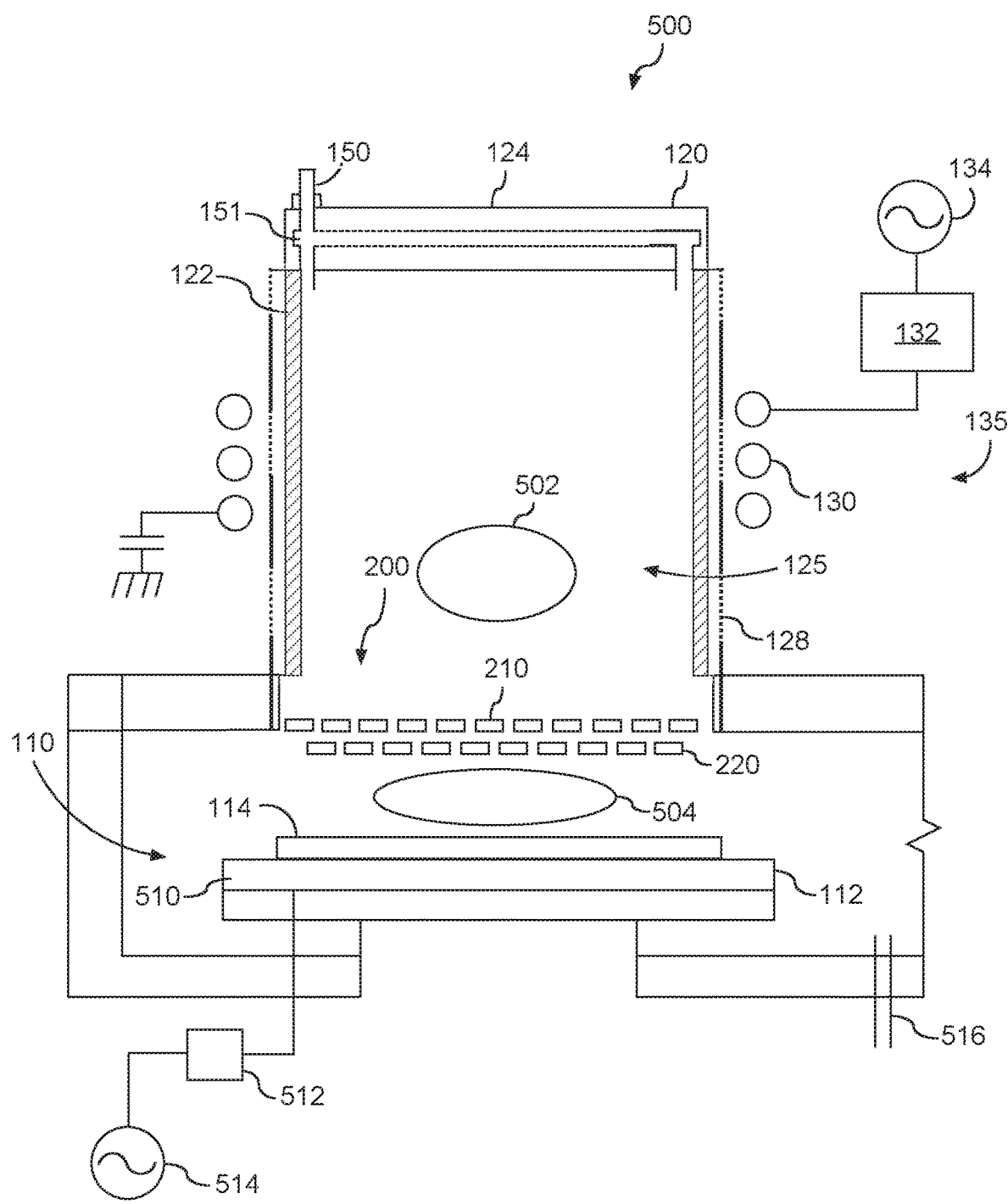
FIG. 4 depicts an example plasma processing apparatus according to example embodiments of the present disclosure.

FIG. 4 depicts an example plasma processing apparatus 100 that can be used to implement processes according to example embodiments of the present disclosure. The plasma processing apparatus 100 includes a processing chamber 110 and a plasma chamber 120 that is separated from the processing chamber 110. Processing chamber 110 includes a workpiece support or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases can be provided to the chamber interior from gas supply 150 and annular gas distribution channel 151 or other suitable gas introduction mechanism. When the induction coil 130 is energized with RF power from the RF power generator 134, a plasma can be generated from a process gas in the plasma chamber 120. In a particular embodiment, the plasma processing apparatus 100 can include an optional grounded Faraday shield 128 to reduce capacitive coupling of the induction coil 130 to the plasma.

As shown in FIG. 4, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be electrically grounded (e.g., coupled to a ground reference).

The example plasma processing apparatus 100 of FIG. 2 is operable to generate a first plasma 502 (e.g., a remote plasma) in the plasma chamber 120. The first plasma 502 can be an inductively coupled plasma. The plasma processing apparatus 100 can be said to be operating in an inductively coupled plasma mode when processing a workpiece using the first plasma 502.

The plasma processing apparatus 100 can generate a second plasma 504 (e.g., a direct plasma) in the processing chamber 110. More particularly, the plasma processing apparatus 100 includes a bias source having bias electrode 510 in the pedestal 112. The bias electrode 510 can be coupled to an RF power generator 514 via a suitable matching network 512. When the bias electrode 510 is energized with RF energy, a second plasma 504 can be generated from a mixture in the processing chamber 110 for direct exposure to the workpiece 114. The second plasma 504 can be a capacitively coupled plasma. The plasma processing apparatus 100 can be said to be operating in a capacitively coupled plasma mode when processing a workpiece using the second plasma 504. The processing chamber 110 can include a gas exhaust port 516 for evacuating a gas from the processing chamber 110.

As shown in FIG. 4, the apparatus 100 can include a gas delivery system 150 configured to deliver process gas to the plasma chamber 120, for instance, via gas distribution channel 151 or other distribution system (e.g., showerhead). The gas delivery system can include a plurality of feed gas lines. The process gas can be delivered to the processing chamber 110 via the separation grid 200 acting as a showerhead. Example process gases for a spacer treatment process, spacer etch process, purge process, and mandrel removal process will be discussed in detail below.

Figure 5:
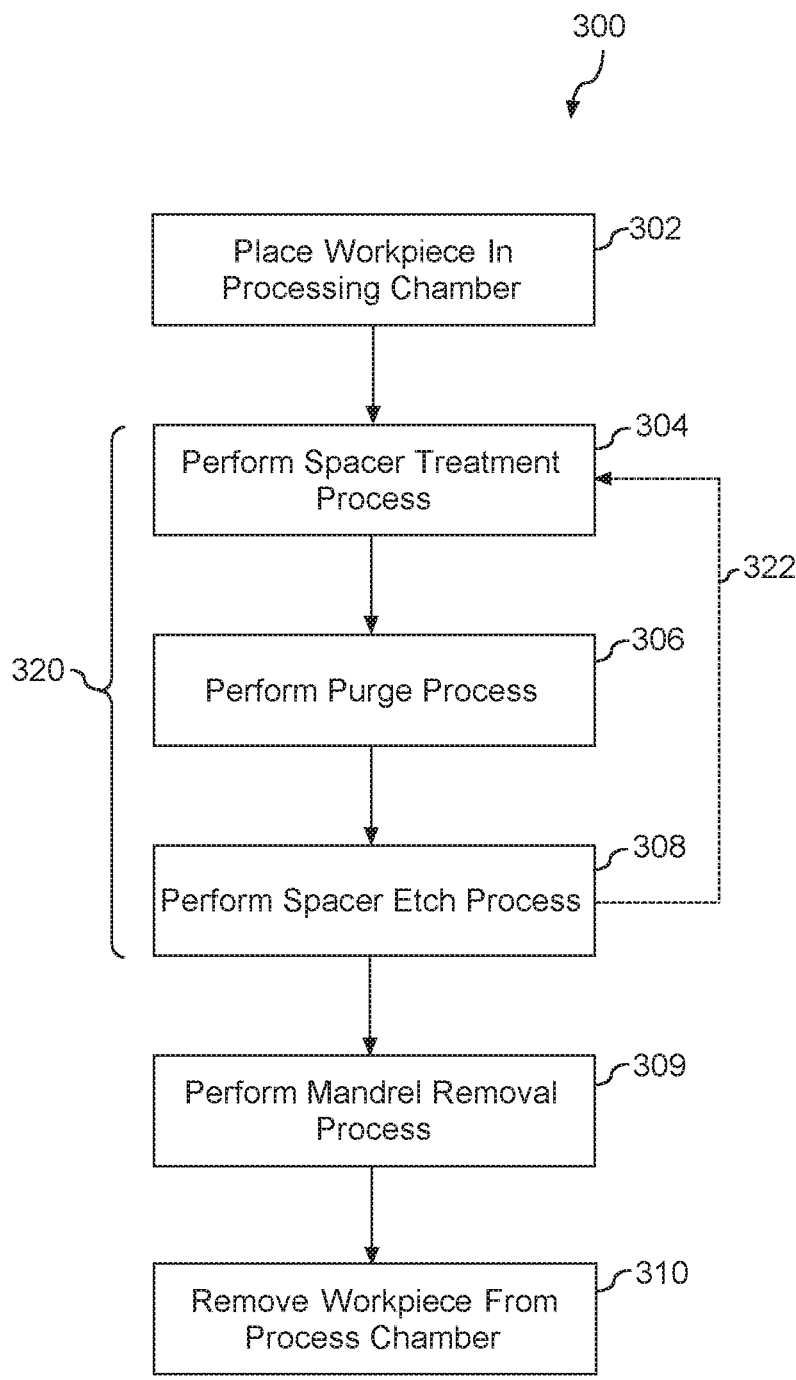
FIG. 5 depicts a method according to example embodiments of the present disclosure.

FIG. 5 depicts a flow diagram of an example method (300) according to example embodiments of the present disclosure. The method (300) can be implemented, for instance, using the plasma processing apparatus 100 of FIG. 4. However, other plasma processing apparatus(s) can be used without deviating from the scope of the present disclosure. FIG. 5 depicts steps performed in a particular order for purposes of illustration and discussion. Those of ordinary skill in the art, using the disclosures provided herein, will understand that various steps of any of the methods described herein can be adapted, omitted, rearranged, repeated, performed simultaneously, expanded, include steps not illustrated, or otherwise rearranged without deviating from the scope of the present disclosure.

At (302), the method includes placing a workpiece on a workpiece support in a processing chamber of a plasma processing apparatus. The processing chamber can be separated from a plasma chamber (e.g., separated by a separation grid assembly). For instance, the method can include placing a workpiece 114 onto workpiece support 112 in the processing chamber 110 of FIG. 4. The workpiece can include a spacer (e.g., SiN spacer) disposed on a mandrel structure (Si mandrel).

At (304), the method can include performing a spacer treatment process. The spacer treatment process can expose a spacer (e.g., SiN spacer) to species generated using a capacitively coupled plasma in the processing chamber (e.g., a direct plasma). The capacitively coupled plasma can be generated from a process gas that includes a hydrogen containing chemistry, such as $H_2$, $CH_4$, etc. The capacitively coupled plasma can be generated, for instance, using an RF bias electrode disposed in the workpiece support.

For instance, a process gas having a hydrogen containing chemistry can be provided from gas supply 150 through separation grid 200 (e.g., acting as a showerhead) into the processing chamber 110 (FIG. 4). The RF bias electrode 510 can be energized with RF energy to generate a capacitively coupled plasma from the process gas in the processing chamber. Species generated in the process gas by the capacitively coupled plasma can be exposed to the spacer structure on the workpiece to treat the workpiece. The spacer treatment process can be performed at reduced pressure (e.g., less than about 100 mTorr).

Example process parameters for a spacer treatment process are provided below:

Process Gas: $H_2$+Dilution Gas
Dilution Gas: $N_2$ and/or Ar and/or He
Process Pressure: about 6 to about 30 mT
RF Bias Source Power: about 20 to about 120 W (bias)
Workpiece Temperature: about 15 to about 35° C.
Process Period: about 10 to about 60 seconds
Gas Flow Rates for Process Gas:
   $H_2$: about 100 to about 500 sccm
   Dilution Gas: about 50 to about 500 sccm After completion of the spacer treatment process, the method (300) can include performing a purge process. The purge process can be performed with or without a plasma. The purge process can include flowing a purge gas (e.g., an inert gas such as Ar, He, etc.) into the processing chamber to purge residuals from the processing chamber.

For example, a purge gas (e.g., an inert gas) can be provided from gas supply 150 through separation grid 200

(e.g., acting as a showerhead) into the processing chamber 110 (FIG. 4). The purge gas can purge residuals and other species remaining in the processing chamber 110 following the spacer treatment process.

After completion of the purge process, the method (300) can include performing a spacer etch process. The spacer etch process can expose a workpiece to radicals (e.g., neutral radicals) generated in a remote plasma chamber. The neutral radicals can be generated from a process gas having a fluorine containing chemistry (e.g., as $NF_3$, $SF_6$, etc.) using an inductively coupled plasma source. Optionally, an $O_2$ gas can be included in the process gas. Optionally, an inert gas can be used as diluent for the process gas.

For example, a process gas can be provided to the plasma chamber interior 125 via gas supply 150 (FIG. 4). An inductively coupled plasma can be induced in the process gas using plasma source 135. Species generated in the inductively coupled plasma can pass through a separation grid assembly 200 to filter ions in the species. Neutral radicals passing through the separation grid assembly can be exposed to the workpiece to perform the spacer etch process.

In some embodiments, the separation grid assembly 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid 200 can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

Example process parameters for a spacer etch process are provided below:
Process Gas: $NF_3$+Dilution Gas
Dilution Gas: $N_2$ and/or Ar and/or He
Process Pressure: about 300 to about 600 mT
Inductively Coupled Plasma Source Power: 0 W bias; about 850 to about 1500 W source
Workpiece Temperature: about 15 to about 35° C.
Process Period: about 10 to about 60 seconds
Gas Flow Rates for Process Gas:
  $NF_3$: about 10 to about 200 sccm
  Dilution Gas: about 200 to about 1000 sccm As shown in FIG. 5, the spacer treatment process 304, purge process 306, and 308 can form one cycle 320 of a cyclic process. As indicated by 322, the cycle 320 can be repeated in cyclic fashion until the spacer has been opened and a mandrel structure exposed.

At (310), the method can include performing a mandrel removal process. Any suitable process for etching the mandrel can be used without deviating from the scope of the present disclosure. In some embodiments, the mandrel removal process can expose the mandrel to radicals generated by a plasma in a remote plasma source to remove the silicon mandrel. For instance, in some embodiments, a fluorine containing gas (e.g., nitrogen trifluoride ($NF_3$) or tetrafluoromethane ($CF_4$) or other fluorine containing hydrocarbons such as $CH_2F_2$, $CHF_3$, $CH_3F$) can be used to create highly selective species associated with a remote ICP plasma source for removal of a silicon mandrel with reduced damage to spacers and sublayers.

More particularly, one example mandrel removal process can include generating species from a process gas using an inductive coupling element in a remote plasma chamber. The process can include introducing a fluorine containing gas (e.g., nitrogen trifluoride ($NF_3$) or tetrafluoromethane ($CF_4$) or other fluorine containing hydrocarbons such as $CH_2F_2$, $CHF_3$, $CH_3F$) with the species to create a mixture. The method can include exposing the silicon structure of the workpiece to the mixture to remove at least a portion of the silicon mandrel. In some embodiments, the process gas can further include hydrogen ($H_2$). In some other embodiments, the process gas can also include an inert gas, such as helium (He), or argon (Ar).

In some embodiments, the process gas can include inert gas. The inert gas can be admitted into the plasma chamber. The fluorine containing gas (e.g., $NF_3$ or $CF_4$ or other fluorine containing hydrocarbons such as $CH_2F_2$, $CHF_3$, $CH_3F$) can be injected outside of the plasma chamber and at downstream flow location from the plasma chamber. For instance, the fluorine containing gas (e.g., $NF_3$ or $CF_4$ or other fluorine containing hydrocarbons such as $CH_2F_2$, $CHF_3$, $CH_3F$) can be injected via a post-plasma gas injection source. As an example, the post-plasma gas injection source can be located between a first grid plate and a second grid plate of a separation grid that can separate the plasma chamber from a processing chamber. In some embodiments, the post plasma gas injection source can be located beneath the separation grid in the processing chamber.

Example process parameters for a mandrel removal process using an inductively coupled plasma source according to example embodiments of the present disclosure are provided below:
Process Gas: $CF_4$, $NF_3$, $H_2$
Dilution Gas: He/Ar
Process Pressure: about 200 mTorr to about 1000 mTorr (e.g., about 600 mTorr)
Inductively Coupled Plasma Source Power: about 600 W to about 2500 W (e.g., about 1500 W)
Capacitively Coupled Plasma Source Power: about 0 W to about 150 W (e.g., about 50 W)
Workpiece Temperature: (20° C.) about 5° C. to 90° C. (e.g., about 20° C.)
Process Period: about 10 seconds to 200 seconds (e.g., 40 seconds)
Gas Flow Rates for Process Gas: about 50 sccm to about 500 sccm (e.g., 310 sccm)

At (312) of FIG. 5, the method can include removing the workpiece from the processing chamber. Additional process steps can be performed (e.g., transferring the spacer to underlying substrate) prior to removing the workpiece from the processing chamber without deviating from the scope of the present disclosure.

Figure 6:
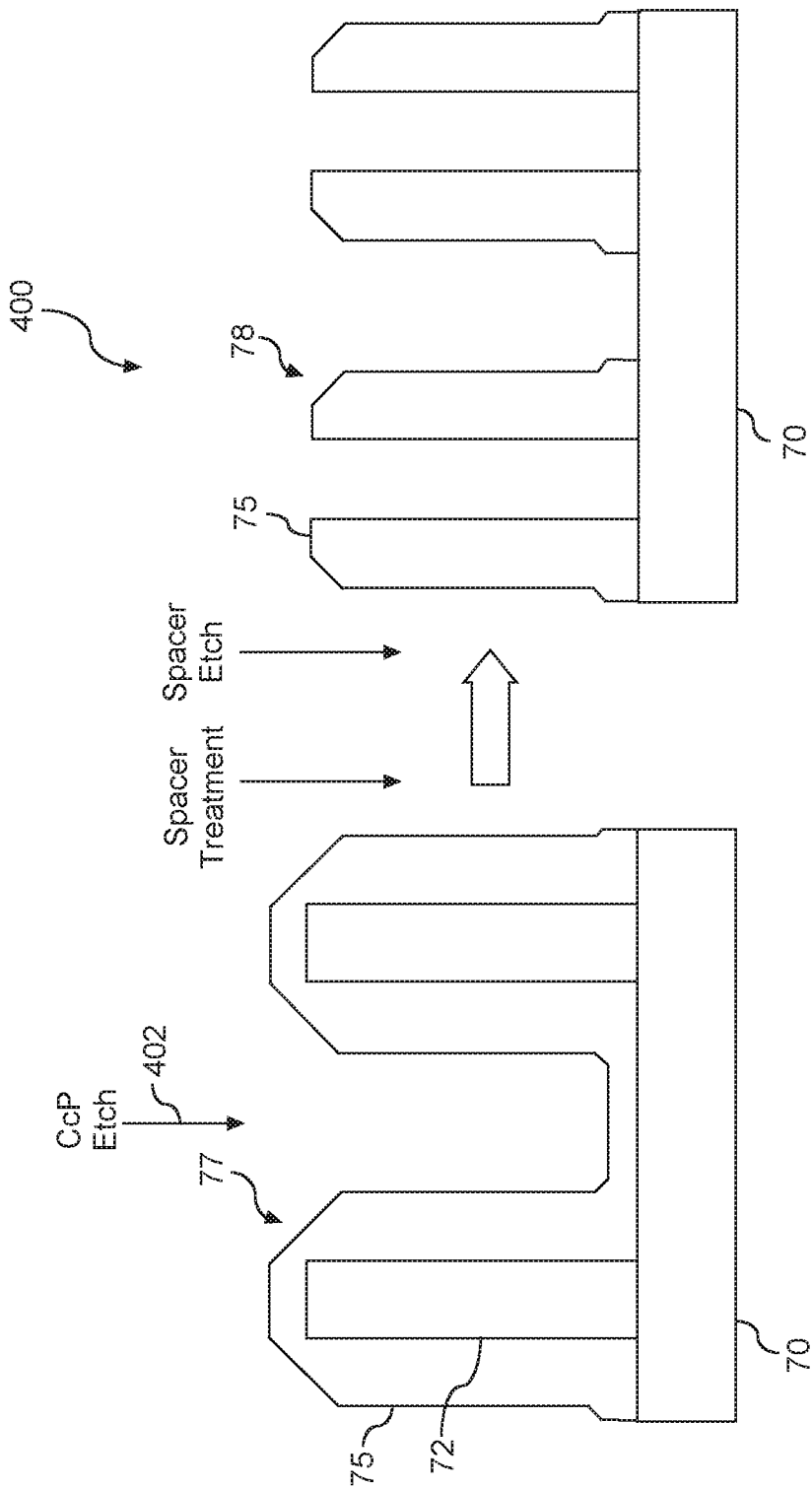
FIG. 6 depicts a process according to example embodiments of the present disclosure.

Variations and modifications can be made to example aspects of the present disclosure. For instance, the process(es) can be used on other structures that may need quasi-atomic-layer etching, such as an etch-back process that requires precise control. The process(es) can be combined with other processes. For example, as shown in FIG. 6, a process (400) can include implementing a standard capacitively coupled plasma (CCP) etch process 402 (without treatment) for a certain process period on a spacer layer 75 (e.g., SiN spacer) disposed on a mandrel structure 72 (e.g., Si mandrel). The standard CCP etch process can create a spacer profile edge 77 with a sharper profile. Following the standard CCP etch process, a spacer treatment process and spacer etch process can be implemented (e.g., cyclically) according to example aspects of the present disclosure (followed by a mandrel removal process) to generate spacers 75 with a duller profile edge 78 relative to performing just a standard CCP etch process. In this way, process parameters such as the length of time and/or percentage of spacer material being etched using the standard CCP etch process prior to a spacer treatment and spacer etch processes can be controlled to obtain a desired profile shape for the spacer.

Moreover, process parameters of the spacer treatment and spacer etch processes according to example aspects of the present disclosure can be adjusted to achieve a desired spacer profile. For instance, in one example, the process pressure can be increased (e.g., from 6 mTorr to 30 mTorr) to create top-to-bottom loading. The increased pressure can be applicable in the case that the etch profile is desired to be inverted-conical shaped or that a larger spacer top critical dimension is needed.

Increased pressure can also be used for the case of SAQP, where it is desired to open the top and bottom spacer and remove the mandrel core in the presence of another material layer above the mandrel from the previous SADP pattern transfer. In this case, with a higher pressure, the loading can slow down the bottom spacer etch rate and the remaining bottom spacer layer can act as a protection layer while the material above the mandrel is being removed.

Figure 7:
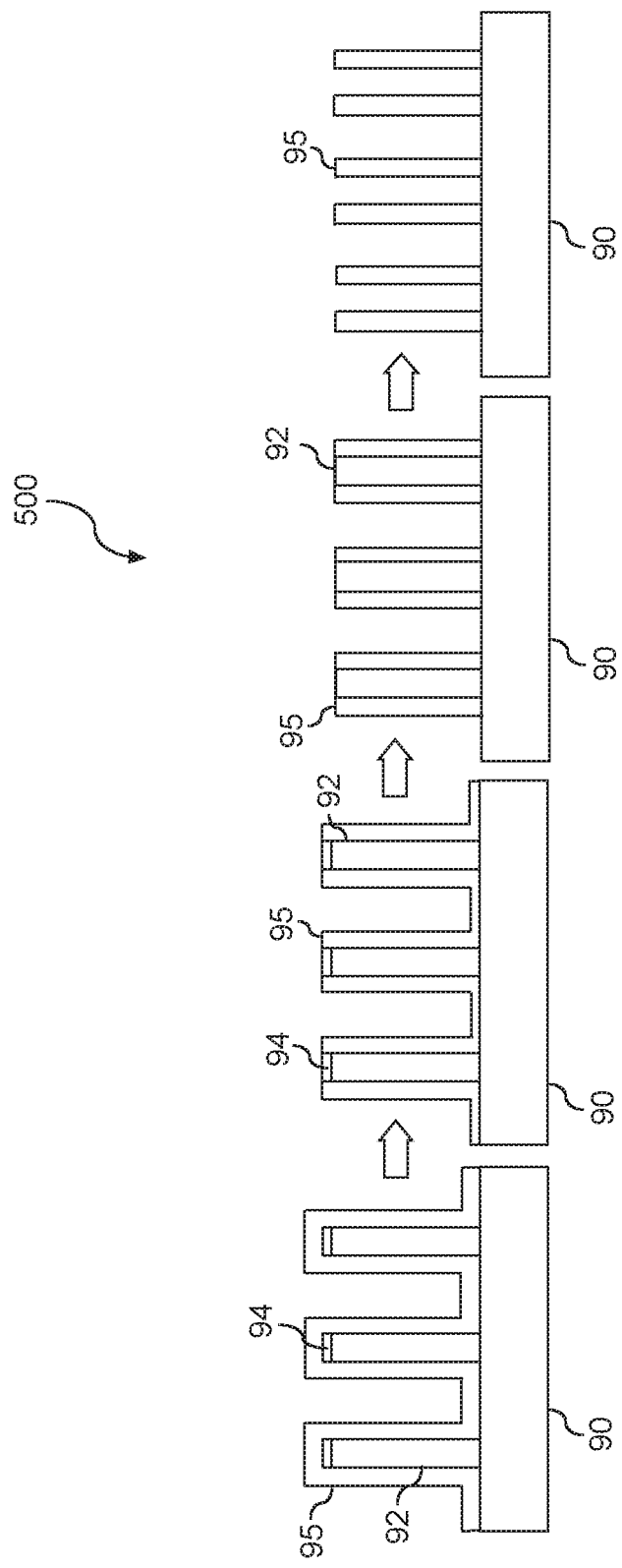
FIG. 7 depicts a process according to example embodiments of the present disclosure.

For example, FIG. 7 depicts an example process 500 where increased pressure is used for a spacer etch process. For instance, a workpiece can include a spacer layer 95 disposed over a mandrel structure 92 on a substrate 90. The top of the mandrel structure 92 can include a layer 94 of the same material as the substrate 90 that is left over from a previous transfer step. Increased pressure can be during the spacer treatment and/or spacer etch process(es) according to example aspects of the present disclosure to create a top loading and slow down the bottom spacer etch. This can result in a portion 97 of the spacer layer 95 remaining over the substrate when the mandrel structure 92 is exposed. This portion 97 of the spacer layer 95 can protect the substrate 90 from etching when removing the layer 84 from the top of the mandrel structure 92.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the method comprising:
   placing a workpiece on a workpiece support in a processing chamber, the workpiece comprising a spacer layer disposed over a mandrel structure, the processing chamber being separated from a plasma chamber by a grounded separation grid;
   performing a spacer treatment process in the processing chamber to expose the workpiece to species generated from a first process gas in a first plasma to perform a spacer treatment process on the spacer layer on the workpiece, the first plasma being generated in the processing chamber, wherein the first plasma is a capacitively coupled plasma generated using an RF bias electrode in the workpiece support;
   after performing the spacer treatment process, performing a spacer etch process in the processing chamber to expose the workpiece to neutral radicals generated from a second process gas in a second plasma to etch at least a portion of the spacer layer on the workpiece, the second plasma being an inductively coupled plasma generated in the plasma chamber that is remote from the processing chamber and separated from the plasma chamber by the separation grid, the separation grid configured to filter ions in the second plasma;
   performing a mandrel removal process on the workpiece in the processing chamber to remove the mandrel structure, the mandrel removal process comprising exposing the mandrel to radicals generated in a third process gas from a third plasma generated in the plasma chamber;
   after performing the mandrel removal process, removing the workpiece from the processing chamber.

2. The method of claim 1, wherein the first process gas comprises a hydrogen containing gas.

3. The method of claim 2, wherein the first process gas comprises $H_2$ gas.

4. The method of claim 2, wherein the first process gas comprises $CH_4$ gas.

5. The method of claim 1, wherein the second process gas comprises a fluorine containing gas.

6. The method of claim 5, wherein the second process gas comprises one or more of $NF_3$, $SF_6$, or $CF_4$.

7. The method of claim 1, wherein the spacer treatment process and the spacer etch process are performed cyclically in an alternating manner.

8. The method of claim 1, wherein the method further comprises performing a purge process between performing the spacer treatment process and the spacer etch process.

9. The method of claim 8, wherein the purge process comprises flowing an inert gas into the processing chamber.

10. The method of claim 1, wherein the spacer layer is a SiN layer.

11. The method of claim 1, wherein the third process gas comprises $O_2$.

12. The method of claim 1, wherein the spacer treatment process and the spacer etch process are performed as part of a self-aligned multiple patterning process.

\* \* \* \* \*